(12) United States Patent
Hayashi et al.

(10) Patent No.: US 7,488,655 B2
(45) Date of Patent: Feb. 10, 2009

(54) METHOD FOR FABRICATING SEMICONDUCTOR DEVICE

(75) Inventors: Shigenori Hayashi, Nara (JP); Kazuhiko Yamamoto, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/756,248

(22) Filed: Jan. 14, 2004

(65) Prior Publication Data
US 2004/0157473 A1 Aug. 12, 2004

(30) Foreign Application Priority Data
Feb. 12, 2003 (JP) .............................. 2003-033373

(51) Int. Cl.
*H01L 21/336* (2006.01)
*H01L 21/31* (2006.01)
(52) U.S. Cl. ................ 438/287; 438/785; 257/E21.271
(58) Field of Classification Search ................ 438/197, 438/216, 287, 785
See application file for complete search history.

(56) References Cited
U.S. PATENT DOCUMENTS

| | | | | |
|---|---|---|---|---|
| 5,017,277 | A * | 5/1991 | Yoshida et al. ......... | 204/298.02 |
| 6,013,553 | A | 1/2000 | Wallace et al. | |
| 6,020,243 | A | 2/2000 | Wallace et al. | |
| 6,245,606 | B1 | 6/2001 | Wilk et al. | |
| 6,391,727 | B1 | 5/2002 | Park | |
| 6,426,272 | B1 * | 7/2002 | Fu et al. ..................... | 438/435 |
| 6,573,193 | B2 * | 6/2003 | Yu et al. ..................... | 438/770 |
| 6,602,753 | B2 * | 8/2003 | Koyama et al. ............. | 438/287 |
| 2002/0014834 | A1 | 2/2002 | Koyama et al. | |

FOREIGN PATENT DOCUMENTS

| | | |
|---|---|---|
| JP | 01-154547 A | 6/1989 |
| JP | 2000-243951 | 9/2000 |
| JP | 2001-210636 | 8/2001 |
| JP | 2001-237424 | 8/2001 |
| JP | 2003-017688 | 1/2003 |
| JP | 2003-249497 | 9/2003 |
| JP | 2005-079563 | 3/2005 |

OTHER PUBLICATIONS

Yamaguchi et al., "Study on Zr-Silicate Interfacial Layer of $ZrO_2$_MIS Structure fabricated by Pulsed Laser Ablation Deposition Method." Extended Abstracts of the 2000 International Conference on Solid State Devices and Materials, Sendai, 2000, pp. 228-229.
Foreign Office Action, dated Sep. 26, 2006 and English Translation thereof.

* cited by examiner

*Primary Examiner*—Alexander G Ghyka
(74) *Attorney, Agent, or Firm*—McDermott Will & Emery LLP

(57) ABSTRACT

A metal film is deposited on a silicon region in a non-oxidizing atmosphere, after which the metal film is oxidized with radicals capable of oxidizing the metal film, such as oxygen radicals, to form a metal oxide film serving as a gate insulating film.

53 Claims, 7 Drawing Sheets

METHOD FOR FABRICATING SEMICONDUCTOR DEVICE

BACKGROUND OF THE INVENTION

The present invention relates to methods for fabricating a semiconductor device including a gate insulating film of high dielectric material.

With recent progress in technologies for increasing the packing density and the speed of a semiconductor device, MOSFETs in the device have been increasingly miniaturized. However, if a gate insulating film thereof is made thinner in accordance with this miniaturization, the problem of, for example, an increase in a gate leakage current resulting from a tunnel current becomes apparent. To solve this problem, a technique is studied in which use of a metal oxide such as hafnium oxide ($HfO_2$) or zirconium oxide ($ZrO_2$), that is to say, a high dielectric material for the gate insulating film accomplishes a reduced equivalent silicon oxide ($SiO_2$ film) thickness EOT (Equivalent Oxide Thickness) and simultaneously makes the physical thickness of the film greater. An example of the technique is disclosed in Extended Abstracts of the 2000 International Conference on Solid State Devices and Materials (Japan, Aug. 29, 2000), pp. 228-229, which uses $ZrO_2$ for the gate insulating film.

However, it is reported that in the case of the gate insulating film made of metal oxide such as $ZrO_2$, an interface layer (for example, a silicate layer) is created between the surface of a silicon substrate and the gate insulating film of a high dielectric constant. The interface layer has a lower dielectric constant than the metal oxide as the high dielectric material, so that the occurrence of the interface layer disadvantageously reduces the effective dielectric constant of the gate insulating film.

In a gate insulating film of a high dielectric material, it is proposed that a composite film or a film with a gradient composition using various types of metal oxide films be employed as means for enhancing the effective dielectric constant and the heat-resisting properties of the gate insulating film. However, because of the inter-diffusion of these metal oxide films in the deposition or oxidation, the proposal does not always provide a gate insulating film exactly as designed with respect to the thickness of the interface layer and the composition profile of the composite film or the like in the thickness direction.

SUMMARY OF THE INVENTION

With the above in mind, a first object of the present invention is to provide an insulating metal oxide film of stoichiometric composition while creation of an interface layer acting as a low dielectric layer is suppressed. A second object of the present invention is to provide a composite metal oxide film having the interface layer of a desired thickness and having a desired composition.

To accomplish these objects, a method for fabricating a semiconductor device according to the present invention comprises the steps of: depositing a metal film on a silicon region in a non-oxidizing atmosphere; and oxidizing the metal film with oxygen radicals to form a metal oxide film serving as a gate insulating film.

In the method for fabricating a semiconductor device according to the present invention, a metal serving as a material for a high-k gate insulating film is deposited in advance, after which the oxygen radicals are used as an oxidizing species for the metal. Therefore, an adequate adjustment of the oxidation treatment temperature enables supply of oxygen to the metal in an oxidizing atmosphere having a high controllability. This oxidizes the metal film with oxidation of the silicon region such as a silicon substrate minimized, which suppresses creation of an interface layer of a low dielectric constant. As a result, an insulating metal oxide film of stoichiometric composition, that is to say, a high-k gate insulating film can be formed.

In the method for fabricating a semiconductor device according to the present invention, the deposition step of the metal film is separated from the oxidation step of the metal film, so that the oxidation process is not determined by the film deposition mechanism unlike the case of a conventional formation step of a metal oxide film in a high temperature atmosphere. In addition, the oxidation step of the metal film is a relatively low temperature process step carried out by utilizing the reactivity of the oxygen radicals, which prevents the inter-diffusion between atoms constituting the film and the inter-diffusion between atoms constituting the film and silicon atoms contained in the silicon region even in depositing or oxidizing a composite film, a film with a gradient composition or the like. Therefore, a composite metal oxide film (or a film with a gradient composition) can be formed which has a desired interface layer thickness and a desired composition.

Note that in the present invention the non-oxidizing atmosphere indicates an atmosphere containing substantially no oxygen (oxidizing species).

In the method for fabricating a semiconductor device according to the present invention, the oxygen radicals may be supplied either by a plasma generator using a gas containing oxygen or by an ozone generator. In the case of using the ozone generator, ozone generated in the ozone generator decomposes at the surface of the silicon region into oxygen radicals and oxygen molecules, thereby supplying the oxygen radicals.

Preferably, in the method for fabricating a semiconductor device according to the present invention, a region for oxidizing the metal film is substantially separated from a region for generating the oxygen radicals.

This prevents entry of oxygen ions generated together with the oxygen radicals during a remote plasma oxidation into the region for oxidizing the metal film.

Preferably, in the method for fabricating a semiconductor device according to the present invention, the oxidation of the metal film is performed on a sample holder kept at a floating electric potential.

This prevents or suppresses oxygen ions from oxidizing the metal film during a plasma oxidation or the like.

In the method for fabricating a semiconductor device according to the present invention, the lower limit of the oxidation temperature for oxidizing the metal film may be equal to the minimum temperature capable of oxidizing the metal film by the oxygen radicals. Specifically, the lower limit of the oxidation temperature for oxidizing the metal film such as a Hf film is about 300° C.

In the method for fabricating a semiconductor device according to the present invention, the upper limit of the oxidation temperature for oxidizing the metal film may be equal to the minimum temperature capable of developing oxidation of the metal film by oxygen atoms or oxygen molecules. Specifically, the upper limit of the oxidation temperature for oxidizing the metal film is about 500° C.

In the method for fabricating a semiconductor device according to the present invention, in oxidizing the metal film, the number of oxygen radicals impinging onto the metal film, or the time or the temperature of the oxidation treatment with the oxygen radicals may be adjusted to control the thickness of an interface layer created at the interface between the metal oxide film and the silicon region.

This improves the reliability of the gate insulating film or the carrier mobility of the device.

In the method for fabricating a semiconductor device according to the present invention, it is preferable that the temperature of the silicon region during the deposition of the metal film is set at less than 300° C. and when metal particles constituting the metal film impinge onto the silicon region, the energy of each metal particle is set at 1 eV or smaller.

This prevents the interface layer from being created between the silicon region and the metal film. Moreover, this prevents damage to the silicon region by the metal particle bombardment.

In the method for fabricating a semiconductor device according to the present invention, in depositing the metal film, the thickness of the metal film may be set so that the metal oxide film formed by oxidizing the metal film has a thickness less than 3 nm. This pronouncedly produces the above-described advantageous effect of the present invention.

In the method for fabricating a semiconductor device according to the present invention, in depositing the metal film, the thickness of the metal film may be set at less than 1.9 nm. This pronouncedly produces the above-described advantageous effect of the present invention.

In the method for fabricating a semiconductor device according to the present invention, an element constituting the metal film may be selected from the group consisting of hafnium, zirconium, titanium, tantalum, aluminum, and silicon, which ensures an increase in dielectric constant of the gate insulating film. In this case, two or more elements constituting the metal film may be selected from the group, which enhances the dielectric constant and the heat-resisting properties of the gate insulating film. Moreover, the two or more elements selected from the group may be varied in their contents in the metal film along the thickness direction of the metal film.

In the method for fabricating a semiconductor device according to the present invention, instead of the metal film, a metal nitride film may be deposited on the silicon region. This enhances the dielectric constant and the heat-resisting properties of the gate insulating film.

In the method for fabricating a semiconductor device according to the present invention, after the formation of the gate insulating film, the gate insulating film may be subjected to thermal treatment, which improves the film quality of the gate insulating film. In this case, the thermal treatment may be performed in an atmosphere containing substantially no oxygen such as an atmosphere consisting of an inert gas or a vacuum atmosphere, which prevents oxygen from being supplied to the interface layer and then suppresses the growth of the interface layer.

To accomplish the objects described above, another method for fabricating a semiconductor device according to the present invention comprises the steps of: depositing a metal film on a silicon region in a non-oxidizing atmosphere; and oxidizing the metal film with radicals capable of oxidizing the metal film to form a metal oxide film serving as a gate insulating film.

In another said method for fabricating a semiconductor device according to the present invention, a metal serving as a material for a high-k gate insulating film is deposited in advance, after which the radicals capable of oxidizing (or oxynitriding) the metal film, such as oxygen radicals, NO radicals or $N_2O$ radicals, are used as an oxidizing (or oxynitriding) species for the metal. Therefore, an adequate adjustment of the oxidation treatment temperature enables supply of oxygen to the metal in an oxidizing atmosphere having a high controllability. This oxidizes the metal film with oxidation of the silicon region such as a silicon substrate minimized, which suppresses creation of an interface layer of a low dielectric constant. As a result, an insulating metal oxide film of stoichiometric composition, that is to say, a high-k gate insulating film can be formed.

In another said method for fabricating a semiconductor device according to the present invention, the deposition step of the metal film is separated from the oxidation step of the metal film, so that the oxidation process is not determined by the film deposition mechanism unlike the case of a conventional formation step of a metal oxide film in a high temperature atmosphere. In addition, the oxidation step of the metal film is a relatively low temperature process step carried out by utilizing the reactivity of the radicals acting as an oxidizing species, which prevents the inter-diffusion between atoms constituting the film and the inter-diffusion between atoms constituting the film and silicon atoms contained in the silicon region even in depositing or oxidizing a composite film or a film with a gradient composition. Therefore, a composite metal oxide film can be formed which has a desired interface layer thickness and a desired composition.

As is apparent from the above, the present invention relates to methods for forming a high dielectric film, and is of particular usefulness in application to, for example, a fabricating method of an electronic device with a gate insulating film.

DETAILED DESCRIPTION OF THE PREFERRED EMBODIMENTS

Comparison Example

As a comparison example with embodiments of the present invention, a conventional method for forming a gate insulating film with a high dielectric constant made of a metal oxide will be described below with reference to the accompanying drawings.

Figure 1:
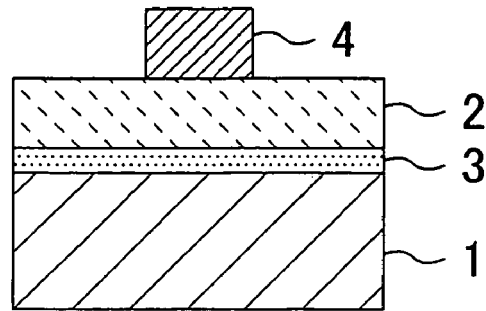
FIG. 1 is a sectional view illustrating a certain process step of a method for forming a high dielectric gate insulating film according to a comparison example.

FIG. 1 is a sectional view illustrating a certain process step of the forming method of a high dielectric gate insulating film according to the comparison example.

Referring to FIG. 1, first, a p-type silicon substrate 1 is introduced inside a chamber of a film growth apparatus. As the film growth apparatus, use is made of an apparatus based on direct current sputtering. Next, a metal oxide film 2 is formed directly on the silicon substrate 1. As the metal oxide film 2, use is made of a metal oxide film of hafnium oxide ($HfO_2$).

In the formation of the metal oxide film 2 by sputtering, using hafnium (Hf) metal for a target and an atmosphere consisting of a mixed gas of argon (Ar) gas and oxygen ($O_2$) gas, a voltage (direct current) is applied to allow the inside of the chamber to discharge. Thus, the metal oxide film 2 of a $HfO_2$ film is formed by reactive sputtering. During this formation, the sputtering time can be controlled to provide the $HfO_2$ thin film with a thickness of about 3 to 10 nm.

Figure 2A:
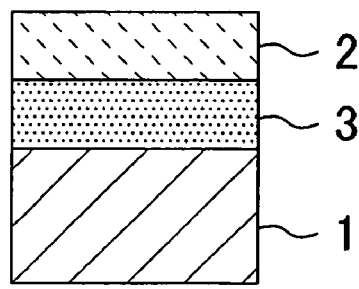
FIG. 2A is a sectional view illustrating the state in which a thick interface layer is created in the method for forming a high dielectric gate insulating film according to the comparison example.

In the formation step of the metal oxide film 2, however, an interface layer 3 with a thickness of about 3 nm is created between the silicon substrate 1 and the $HfO_2$ film as the metal oxide film 2, as shown in FIGS. 1 and 2A. The interface layer 3 is created resulting from the diffusion of silicon from the silicon substrate 1 and the diffusion of oxygen from the atmosphere. The interface layer 3 is considered to be a silicate layer containing a considerable amount of silicon oxide.

Subsequently, on the metal oxide film 2, a film of tungsten (W) or the like is deposited by sputtering, after which the W film is patterned by well-known lithography and dry etching to form a gate electrode 4. Thus, a capacitor structure is obtained.

Figure 3:
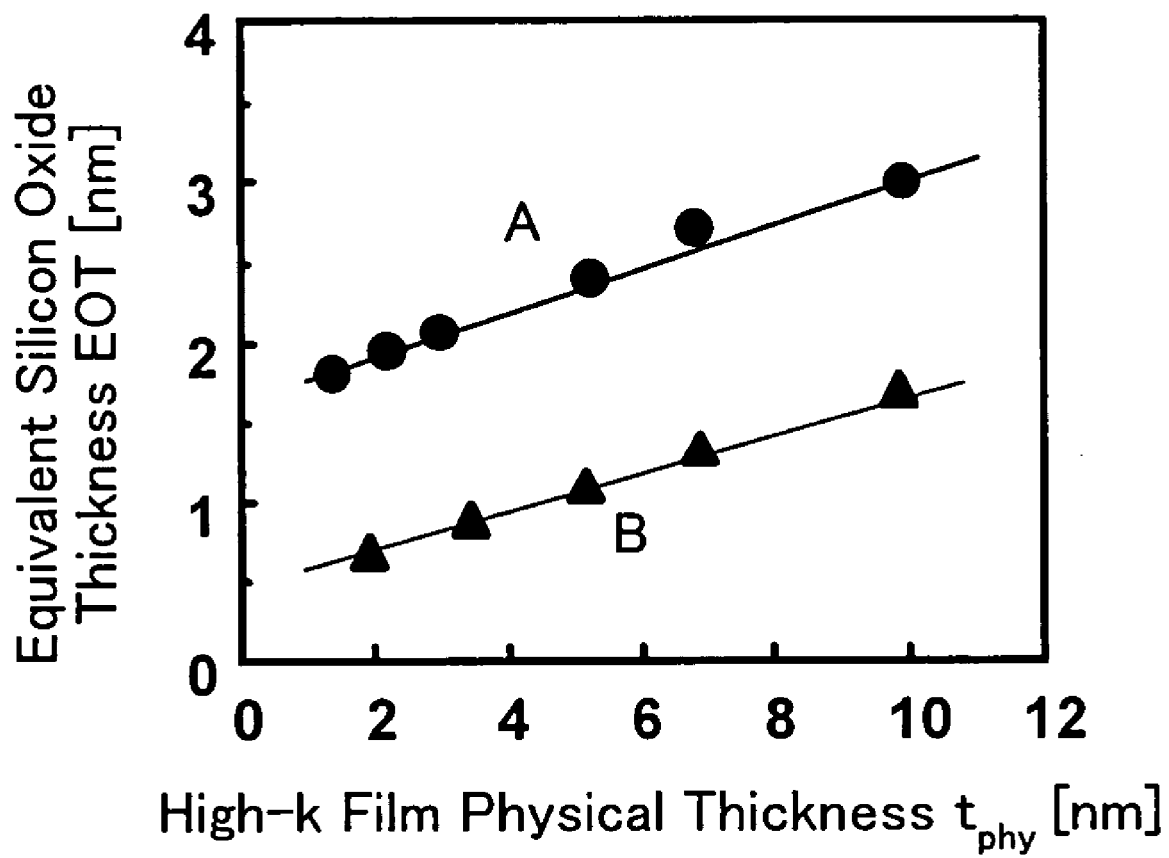
FIG. 3 is a graph illustrating the capacitor properties of gate insulating films formed based on the methods for forming a high dielectric gate insulating film according to the first embodiment of the present invention and the comparison example, respectively.

The capacitor properties of the thin metal oxide films (high-k gate insulating films) with thicknesses of 1.3 to 10 nm formed by the comparison example (the relation between the physical thickness of the high-k film and the equivalent silicon oxide thickness EOT) are shown as the line A in the graph of FIG. 3. FIG. 3 plots the physical thickness $t_{phy}$ (nm) of the deposited high-k film in abscissa and the equivalent silicon oxide thickness EOT (nm) obtained by the C-V measurement in ordinate. The inclination of the line in the graph of FIG. 3 corresponds to the reciprocal of the relative dielectric constant k of the high-k film. Therefore, it is seen from the line A of FIG. 3 that k is equal to 30. An intercept (a y intercept) of about 1.5 nm, which is obtained by extrapolating the line A of FIG. 3 to the ordinate, corresponds to the EOT value of the interface layer. Accordingly, considering that the interface layer has a physical thickness of 3 nm in the comparison example, it is found that the relative dielectric constant of the interface layer is about twice that of a silicon oxide film, which is about eight. However, the expected EOT value of a high-k gate insulating film in its introduction stage is now estimated to be about 1.3 nm or smaller, so that it is necessary to minimize creation of such an interface layer with a great EOT value.

The reason why such a thick interface layer is created in the forming method of a gate insulating film according to the comparison example is considered as follows. Since oxygen ions and oxygen atoms contained in the atmosphere gas have high reactivity, the surface of the silicon substrate is easily oxidized in the early stage of the metal oxide film deposition.

First Embodiment

The following description will be made of a method for fabricating a semiconductor device according to a first embodiment of the present invention, and specifically of a method for forming a gate insulating film with a high dielectric constant made of a metal oxide.

Figure 4A:
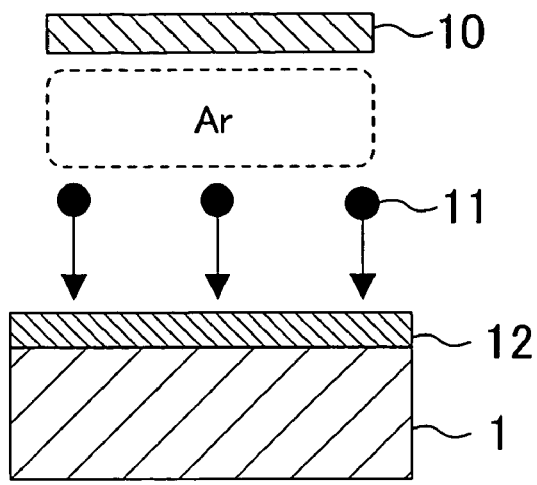
FIGS. 4A to 4C are sectional views illustrating process steps of the method for forming a high dielectric gate insulating film according to the first embodiment of the present invention.
Figure 4B:
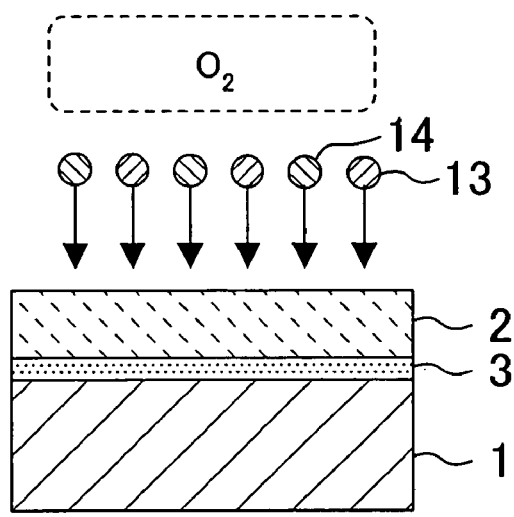
Figure 4C:
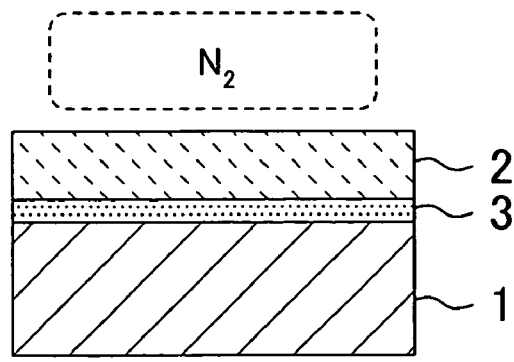

FIGS. 4A to 4C are sectional views illustrating process steps of the method for forming a high dielectric gate insulating film according to the first embodiment, and specifically process steps of a method for forming a gate insulating film of a metal oxide film by oxidizing a metal film.

First, a native oxide on the surface of a p-type silicon substrate 1 is removed with hydrofluoric acid to expose the cleaned surface of the silicon substrate. In this step, the surface of the silicon substrate 1 may optionally be nitrided after the cleaning of the surface thereof. The resulting silicon substrate 1 is then introduced inside a chamber of a film growth apparatus (not shown). As the film growth apparatus, use is made of an apparatus based on physical vapor deposition (PVD) such as direct current sputtering. Specifically, as shown in FIG. 4A, metal atoms (for example, Hf atoms) 11 are impinged by the direct current sputtering onto the silicon substrate 1 to form a metal film (for example, a Hf film) 12 directly on the silicon substrate 1. In the case of forming a hafnium (Hf) metal film as the metal film 12, using, inside the chamber, hafnium metal for a target 10 and a non-oxidizing atmosphere, a voltage (direct current) is applied to allow the inside of the chamber to discharge. Thus, the Hf metal film is formed by reactive sputtering. The non-oxidizing atmosphere used in this formation, such as an atmosphere consisting of argon (Ar) gas shown in FIG. 4A, contains substantially no oxygen (oxidizing species). In addition, the sputtering time can be controlled to provide the Hf thin film (the metal film 12) with a desired thickness. In addition, if the Hf thin film is formed at a substrate temperature lower than the film crystallization temperature (about 600° C.), the resulting Hf thin film is amorphous and does not have a columnar sectional structure.

In depositing the Hf film as the metal film 12, the temperature of the silicon substrate 1 is lowered and the energy of each metal atom is reduced in order to suppress creation and subsequent oxidation of a mixing layer at the interface between the Hf film and the silicon substrate 1. Specifically, it is desirable that the temperature of the silicon substrate 1 be less than 300° C. This allows the thickness of the mixing layer to become small, so that the interface layer created by the oxidation of the mixing layer can be thinned. It is more desirable that the energy (particle energy) of each of metal atoms (Hf atoms) 11 impinging onto the silicon substrate 1 in depositing the Hf film be small (specifically 1 eV or smaller). This prevents damage to the silicon region by the metal particle bombardment as well.

Note that in the sputtering employed in the first embodiment, the particle energy is basically large. However, a low vacuum range of about 400 Pa is selected as the working pressure (the pressure within the chamber) to reduce the particle energy to about 1 eV. Moreover, sputtering is employed in the first embodiment. Alternatively, in order to decrease the particle energy, vacuum evaporation, electron beam evaporation, laser evaporation, CVD (chemical vapor deposition), or the like may be employed which can attain the particle energy almost as much as the heat energy.

Next, as shown in FIG. 4B, the surface of the metal film 12 made of Hf is exposed to an atmosphere mainly containing oxygen radicals 13 as an oxidizing species. During this exposure, considerable amounts of inactive oxygen atoms (or oxygen molecules) 14 are contained in this atmosphere. The metal film 12 is subjected to oxidation treatment in this atmosphere, whereby a metal oxide film (specifically a $HfO_2$ film) 2 serving as a gate insulating film and having stoichiometric composition is formed from the metal film 12. In this formation, an interface layer 3 is created between the silicon substrate 1 and the $HfO_2$ film as the metal oxide film 2. The interface layer 3 is made of a silicon oxide film formed by oxidizing the surface of the silicon substrate 1, or a silicate film containing an extremely small amount of Hf.

Figure 5:
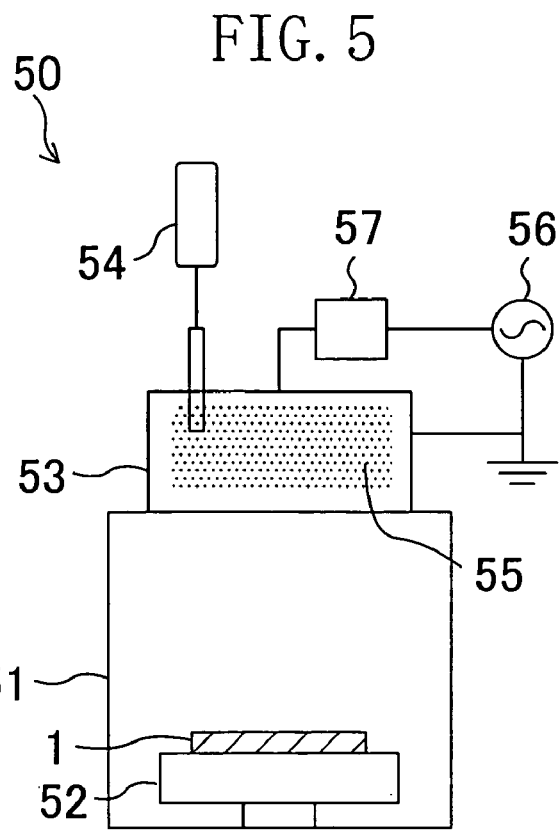
FIG. 5 is a view illustrating a structure of a remote plasma treatment apparatus employed in methods for forming a high dielectric gate insulating film according to first, second and third embodiments of the present invention.

As a generator of the oxygen radicals 13, a plasma generator or an ozone generator can be used. In the first embodiment, a remote plasma treatment apparatus as shown in FIG. 5 can be used as the generator. Oxidation treatment for the surface of the metal film by this apparatus will be described below.

First, as shown in FIG. 5, the silicon substrate (silicon wafer) 1 is introduced into a chamber 51 of a remote plasma treatment apparatus 50 and placed on a substrate holder 52. Subsequently, a gas containing oxygen, such as $O_2$ gas or $N_2O$ gas, is introduced from a gas cylinder 54 into a radical generation chamber 53 placed on the chamber 51. RF power is applied to the radical generation chamber 53 to generate therein plasma 55 containing oxygen. In order to apply the RF power, a high frequency power source 56 is connected to the radical generation chamber 53 through a matcher 57. The chamber 51 and the radical generation chamber 53 are connected with each other through connecting holes.

On generation of the plasma 55, a suitable way of preventing the silicon wafer 1 from being exposed directly to the plasma 55 in the radical generation chamber 53 should be devised in which, for example, oxygen ions are spatially and electrically confined within the radical generation chamber 53. To accomplish this way, in the first embodiment, the substrate holder 52 is kept at a floating potential with no bias power applied, which prevents the silicon wafer 1 from being exposed directly to the plasma 55. Thus, an oxidizing species reaching the silicon wafer 1 can be limited to the oxygen atoms (molecules) 14 and the oxygen radicals 13, not to oxygen ions. As a concrete apparatus employed as the radical generation chamber 53, use may be made of not only plasma generators of various types but also an ozone generator. In the case of using the ozone generator, ozone generated in the ozone generator decomposes at the surface of the silicon region into oxygen radicals and oxygen molecules to supply the oxygen radicals.

As described above, the oxidation treatment of the Hf metal film is performed using the remote plasma treatment apparatus with the gas containing, for example, $O_2$ or $N_2O$ gas or the ozone generator, whereby the Hf metal film can be subjected to the oxidation treatment mainly using the oxygen radicals. An oxygen radical has a higher chemical reactivity than an oxygen atom (molecule) but has a lower kinetic energy for penetrating into the metal film than an oxygen ion.

To form the $HfO_2$ film as a metal oxide film by oxidizing the Hf metal film with oxygen atoms (molecules), thermal treatment in an oxidizing atmosphere at a temperature of several hundred degrees is required. In that case, however, oxygen is inevitably supplied not only to the Hf metal film but also the surface of the silicon substrate, so that an interface layer of a low dielectric constant is created between the silicon substrate and the Hf metal film. As shown as the line A in FIG. 3, the created interface layer reduces the dielectric constant of the whole high-k gate insulating film (in other words, the EOT value increases). Moreover, the thermal treatment at a high temperature causes oxidation of the metal film and concurrently causes crystallization of the metal oxide film, so that leakage current flowing through the grain boundary of the resulting crystal increases to a severe level.

On the other hand, in the case of using oxygen ions for the oxidation, they can oxidize the metal film even at an oxidation treatment temperature of the silicon substrate below about 300° C. Therefore, crystallization of the metal oxide film can be suppressed as well. Moreover, the control of energies of the oxygen ions can suppress and control creation of the interface layer. However, if the thickness of the metal film to be oxidized is around 1 nm or the thickness of the metal oxide film formed by the oxidation is 3 nm or smaller, it becomes difficult, not impossible basically, to fully control low energy ions for treating the film of a very small thickness. Consequently, creation of the interface layer is difficult to suppress.

In contrast to these cases, in the case of using oxygen radicals for oxidation, the chemical reactivity of the oxygen radicals and the thermal diffusion effect thereof at relatively low temperatures are utilized in combination, whereby the oxidation using the oxygen radicals has a process window different from the oxidation using oxygen atoms (molecules) or oxygen ions. This will be described below with reference to FIGS. 6 and 7.

Figure 6:
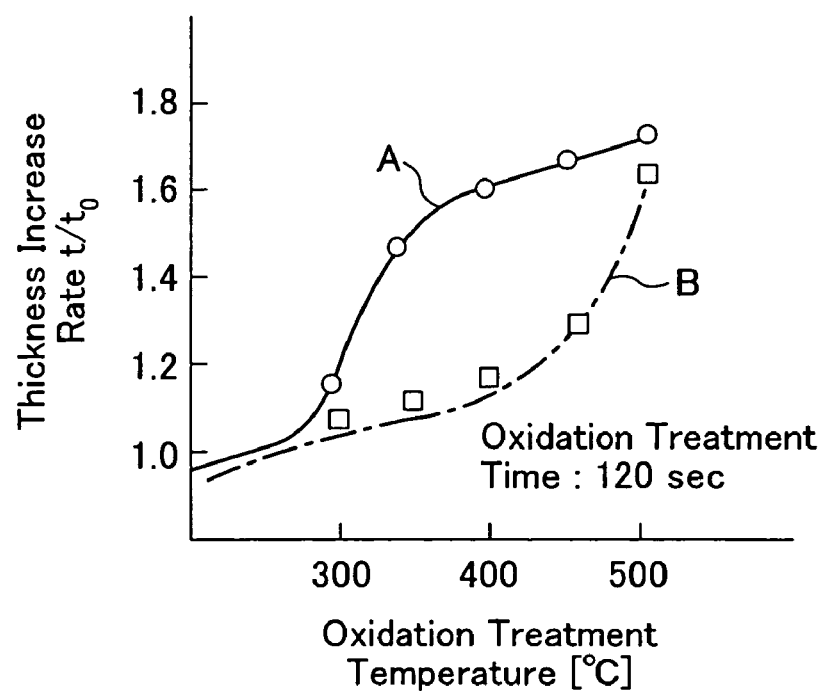
FIG. 6 is a graph illustrating the dependence, on the oxidation treatment temperature, of the increase rate of thickness of a Hf metal film measured after the oxidation in the method for forming a high dielectric gate insulating film according to the first embodiment of the present invention.

In the graph shown in FIG. 6, the curve A shows the dependence, on the oxidation treatment temperature, of the increase rate of thickness of the Hf metal film measured after the oxidation when the Hf metal film is subjected to oxidation treatment with oxygen radicals for a certain period of time (120 seconds). Note that for reference the line B in FIG. 6 shows the dependence, on the oxidation treatment temperature, of the increase rate of thickness of the Hf metal film measured after the oxidation when the Hf metal film is subjected to oxidation treatment with oxygen atoms (oxygen molecules) for a certain period of time (120 seconds). The increase rate of thickness corresponds to the ratio $t/t_0$ of the thickness t of the Hf metal film after the oxidation (the Hf oxide film) to the thickness $t_0$ of the Hf metal film before the oxidation. If a $HfO_2$ film with stoichiometric composition is formed by oxidizing the Hf metal film, $t/t_0$ is about 1.6. Therefore, if oxidation of the Hf metal film increases the film thickness to such an extent that $t/t_0$ reaches an amount around or above 1.6, it is conceivable that an interface layer will be created.

As is seen from FIG. 6, when the temperature of the oxidation treatment with the oxygen radicals is as low as about 300° C., there is no thickness increase indicating oxidation of the Hf metal film as in the case of using oxygen atoms (oxygen molecules). On the other hand, when the temperature of the oxidation treatment with the oxygen radicals is as high as about 500° C., thermal diffusion fully controls the oxidation reaction as in the case of using oxygen atoms (oxygen molecules). Therefore, the interface layer is inevitably created in this temperature. As a result, only the intermediate temperature range (300 to 500° C.) interposed between these temperatures achieves the superiority of the oxygen radicals. That is to say, if oxygen atoms (oxygen molecules) are used in this temperature range, there is no oxidation reaction of the Hf metal film. However, if oxygen radicals are used in this temperature range, there is an increase in thickness of the Hf metal film resulting from the oxidation reaction thereof In this case, it is considered that a specific oxidation mechanism works by utilizing in combination the chemical reactivity of the oxygen radicals and the thermal diffusion effect by the substrate heating.

Figure 7:
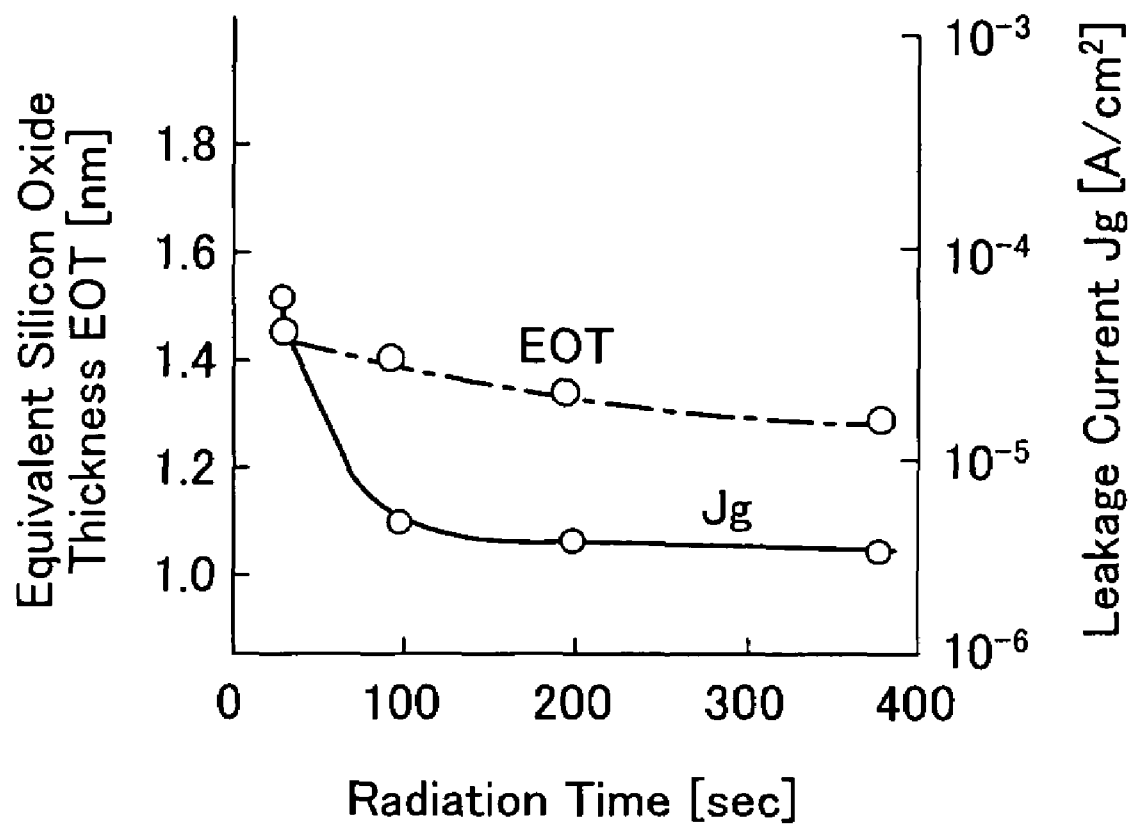
FIG. 7 is a graph illustrating the dependences, on the oxidation treatment time (the time for radiating oxygen radicals), of the equivalent silicon oxide thickness EOT and the leakage current density Jg of a $HfO_2$ film formed by subjecting a Hf metal film with a thickness of 3 nm to oxidation treatment using oxygen radicals at 400° C.

FIG. 7 shows the dependences of the equivalent silicon oxide thickness EOT and the leakage current density Jg of the $HfO_2$ film on the oxidation treatment time (the time for radiating oxygen radicals). The $HfO_2$ film is formed so that the Hf metal film with a thickness of 3 nm is subjected to oxidation treatment with oxygen radicals at 400° C. In this treatment, the oxidation of the metal film depends not only upon the amount of the supplied oxygen radicals but also upon the thermal diffusion of the oxygen radicals. Therefore, as shown in FIG. 7, a fixed treatment time according to the metal film thickness, the oxidation treatment temperature, and the like is required until the metal film is fully oxidized to form the metal oxide film with a stable composition (stoichiometric composition).

As is apparent from the above, in oxidizing the metal film using oxygen radicals, the chemical reactivity of the oxygen radicals and the thermal diffusion effect thereof at relatively low temperatures are utilized in combination, whereby the oxidation of the metal film using the oxygen radicals can have a process window different from the oxidation of the metal film using oxygen atoms (oxygen molecules) or oxygen ions.

Moreover, in forming a metal oxide film (specifically the $HfO_2$ film) with a thickness less than 3 nm, that is to say, in using a metal film to be oxidized with a thickness less than 1.9 nm in which creation of the interface layer has a severe impact on the equivalent silicon oxide thickness EOT, the oxidation treatment technique using oxygen radicals according to the first embodiment has a significant superiority over conventional techniques such as the comparison example.

Also in the first embodiment, to prevent oxygen from being supplied to the interface layer 3 created between the silicon substrate 1 and the Hf metal film 12 with the Hf metal film 12 oxidized, the oxidation treatment time must be controlled in accordance with, for example, the thickness of the Hf metal film 12 to be oxidized and the oxidation treatment temperature. Herein, the metal oxide films (high-k gate insulating films) are formed by subjecting the Hf metal films with various thicknesses (1 to 6 nm) to an equal oxidation treatment based on the first embodiment at a treatment temperature of 400° C. for a treatment time of 120 sec. The capacitor properties of the formed metal oxide films (the relation between the physical thickness of the high-k film and the equivalent silicon oxide thickness EOT) are shown as the line B in the graph of FIG. 3.

In the first embodiment, after the oxidation of the metal film 12 shown in FIG. 4B, that is to say, after the formation step of the metal oxide film 2 serving as a high-k gate insulating film, annealing subsequent to the oxidation treatment is performed as an after treatment step as shown in FIG. 4C. This annealing is to sufficiently improve the film quality of the metal oxide film 2, such as the electric properties. To be more specific, in order to improve the film quality in nonequilibrium condition in the oxidation treatment, that is to say, in order to enhance the binding properties of oxygen atoms to Hf metal atoms and the uniformity of the film, annealing subsequent to the oxidation treatment is performed as an after treatment step. In this annealing, thermal treatment is performed in an atmosphere containing substantially no oxygen (oxidizing species) such as an atmosphere consisting of nitrogen ($N_2$) shown in FIG. 4C or an atmosphere consisting of argon or other inert gas, which prevents oxygen from being supplied to the interface layer 3 and then suppresses an increase in thickness of the interface layer 3. As the atmosphere containing substantially no oxygen, a vacuum atmosphere may be used.

As described above, in the first embodiment, the metal (Hf metal) serving as a material for a high-k gate insulating film is deposited in advance, after which the oxygen radicals 13 are used as an oxidizing species for the metal. Therefore, an adequate adjustment of the oxidation treatment temperature enables supply of oxygen to the metal in an oxidizing atmosphere having a high controllability. This oxidizes the metal film 12 with oxidation of the silicon substrate 1 minimized, which suppresses creation of the interface layer 3 of a low dielectric constant. As a result, an insulating metal oxide film 2 of stoichiometric composition, that is to say, a high-k gate insulating film can be formed.

Figure 2B:
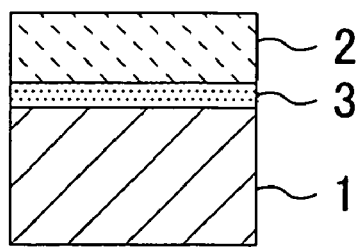
FIG. 2B is a sectional view illustrating the state in which a thin interface layer is created in a method for forming a high dielectric gate insulating film according to a first embodiment of the present invention.

Specifically, if the $HfO_2$ film (the metal oxide film 2) is formed by the sputtering in an oxidizing atmosphere at a temperature of several hundred degrees or higher in the comparison example, the thickness of the interface layer 3 increases as shown in FIG. 2A. On the other hand, in the first embodiment, as shown in FIG. 2B, the thickness of the interface layer 3 decreases, thereby providing excellent electric properties like the line B in FIG. 3. It is concretely found from the line B in FIG. 3 that in the first embodiment employing oxygen radicals, the interface layer contributes about 0.4 nm of the EOT value and that the contribution amount is reduced by about 1 nm as compared to the comparison example.

The detail such as the degree of optimization of each condition is unknown in the first embodiment. However, as noted above, it is considered that a specific oxidation mechanism works by utilizing in combination the chemical reactivity of the oxygen radicals and the thermal diffusion effect by the substrate heating and therefore creation of the interface layer is minimized. Moreover, in forming a metal oxide film with a thickness less than 3 nm, that is to say, in using a metal film to be oxidized with a thickness less than 1.9 nm in which creation of the interface layer has a severe impact on the equivalent silicon oxide thickness EOT, the oxidation treatment technique using oxygen radicals according to the first embodiment has a significant superiority over conventional techniques such as the comparison example.

Further, the oxidation treatment using oxygen radicals according to the first embodiment has the superiority over the oxidation treatment using oxygen ions in that, for example, no direct impact by the plasma distribution or the like is exerted on the film uniformity (for example, if oxygen ions are used in the oxidation treatment, the plasma distribution exerts a direct impact on the film formation) and that the film quality does not suffer any damage by ion bombardment or the like.

In the first embodiment, the deposition step of the metal film 12 is separated from the oxidation step of the metal film 12, so that the oxidation process is not determined by the film deposition mechanism unlike the case of a conventional formation step of a metal oxide film in a high temperature atmosphere. In addition, the oxidation step of the metal film 12 is a relatively low temperature process step carried out by utilizing the reactivity of the oxygen radicals 13, which prevents the inter-diffusion between atoms constituting the film and the inter-diffusion between atoms constituting the film and silicon atoms contained in the silicon substrate even in depositing or oxidizing a composite film or a film with a gradient composition. Therefore, a composite metal oxide film can be formed which has a desired interface layer thickness and a desired composition.

Note that in the first embodiment the silicon region with the high-k gate insulating film formed thereon is not limited to the silicon substrate 1. A silicon film may be used instead, or a substrate or a film mainly made of silicon may be used.

In the first embodiment, the metal film 12 made of Hf is formed directly on the surface of the silicon substrate 1. As a substitute for this procedure, the surface of the silicon substrate 1 may be subjected to nitride treatment (pretreatment) before the metal film 12 is formed. This further suppresses creation of the interface layer.

In the first embodiment, description has been made of Hf as an exemplary material for the metal film 12, but the material is not limited to Hf. Alternatively, zirconium, titanium, tantalum, aluminum, or another metal (such as lanthanum (La), which is selected from the rare-earth metal group) may be used. This contributes to an increase in the dielectric constant of the metal oxide film (that is, the high-k gate insulating film) formed by oxidizing the metal film. As an element constituting the metal film 12, two or more elements may be selected from hafnium, zirconium, titanium, tantalum, aluminum, another metal (such as lanthanum (La), which is selected from the rare-earth metal group), and silicon. This enhances the dielectric constant and the heat-resisting properties of the high-k gate insulating film. In this selection, the two or more selected elements may be varied in their contents in the metal film along the thickness direction of the metal film.

In the first embodiment, the lower limit of the oxidation temperature for oxidizing the metal film 12 may be equal to the minimum temperature capable of oxidizing the metal film 12 by oxygen radicals 13. For example, if the metal film 12 is made of Hf metal, the lower limit thereof is 300° C.

In the first embodiment, the upper limit of the oxidation temperature for oxidizing the metal film 12 may be equal to the minimum temperature capable of developing oxidation of the metal film 12 by oxygen atoms or oxygen molecules. For example, if the metal film 12 is made of Hf metal, the upper limit thereof is 500° C.

In the first embodiment, an oxygen radical is used as a radical acting as an oxidizing species for the metal film 12. Alternatively, use may be made of an NO radical, $N_2O$ radical or another radical.

In the first embodiment, after the formation step of the metal oxide film 2 shown in FIG. 4B, provision may be made of the step of depositing another metal film on the metal oxide film 2 in an atmosphere containing substantially no oxygen and the step of oxidizing another said metal film in an atmosphere containing oxygen to form another metal oxide film serving as a gate insulating film. That is to say, deposition of a thin metal film and oxidation of the thin metal film may be repeatedly performed. This fully oxidizes the metal film and then facilitates formation of a metal oxide film with stoichiometric composition.

In the first embodiment, the gate insulating film has been described as an exemplary use of the metal oxide film 2, that is, the high-k film. It is needless to say that the high-k film may alternatively be put to another use such as a capacitor insulating film.

Second Embodiment

The following description will be made of a method for fabricating a semiconductor device according to a second embodiment of the present invention and more specifically of a method for forming a gate insulating film with a high dielectric constant made of a metal oxide. A characteristic of the second embodiment is to employ, as a high dielectric material constituting the gate insulating film, an oxynitride film of every type of metal which is proposed as means for improving the effective dielectric constant and the heat-resisting properties of the gate insulating film. To be more specific, description will be made of a method for providing a metal oxynitride film made of a high dielectric material, that is, a metal oxynitride film used for a gate insulating film by subjecting a metal nitride film to oxidation treatment using oxygen radicals.

Figure 8A:
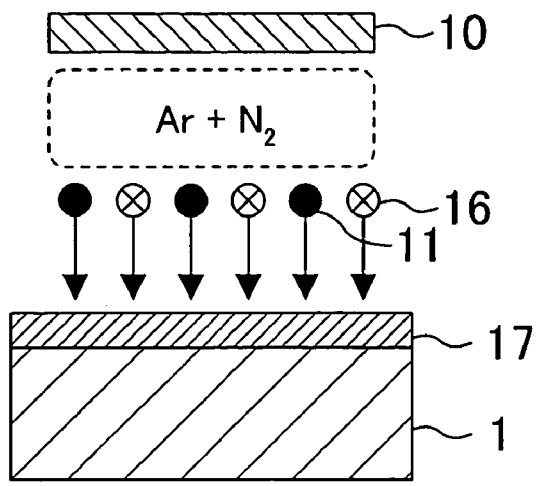
FIGS. 8A to 8C are sectional views illustrating process steps of the method for forming a high dielectric gate insulating film according to the second embodiment of the present invention.
Figure 8B:
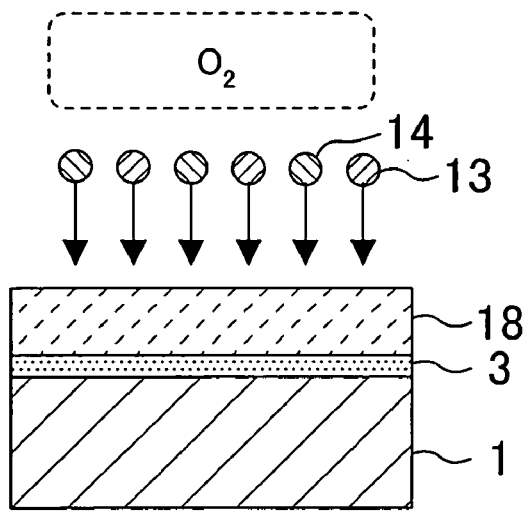
Figure 8C:
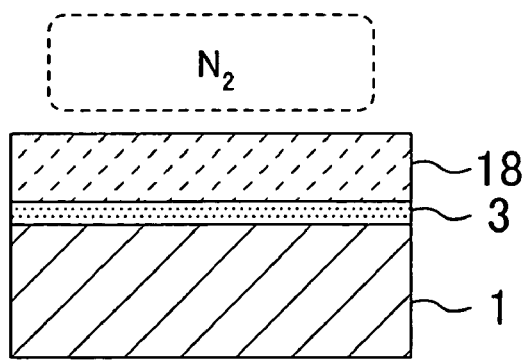

FIGS. 8A to 8C are sectional views illustrating process steps of the method for forming a high dielectric gate insulating film according to the second embodiment.

First, a native oxide on the surface of a p-type silicon substrate 1 is removed with hydrofluoric acid to expose the cleaned surface of the silicon substrate. In this step, the surface of the silicon substrate 1 may optionally be nitrided after the cleaning of the surface thereof. The resulting silicon substrate 1 is then introduced inside a chamber of a film growth apparatus (not shown). As the film growth apparatus, use is made of an apparatus based on PVD technique such as direct current sputtering. Specifically, as shown in FIG. 8A, metal atoms (for example, Hf atoms) 11 and nitrogen atoms 16 are impinged by the direct current sputtering onto the silicon substrate 1 to form a metal nitride film (for example, a HfN (hafnium nitride) film) 17 directly on the silicon substrate 1. In the case of forming a HfN metal nitride film as the metal nitride film 17, using, inside the chamber, hafnium metal for a target 10 and a non-oxidizing atmosphere (see FIG. 8A) consisting of Ar gas and nitrogen ($N_2$) gas, a voltage (direct current) is applied to allow the inside of the chamber to discharge. Thus, the HfN metal nitride film is formed by reactive sputtering.

As is apparent from the above, the second embodiment differs from the first embodiment (see FIGS. 4A to 4C) in that the HfN metal nitride film 17 instead of the Hf metal film 12 is formed on the silicon substrate 1.

Next, as shown in FIG. 8B, the surface of the metal nitride film 17 made of HfN is exposed to an atmosphere mainly containing oxygen radicals 13 as an oxidizing species. During this exposure, considerable amounts of inactive oxygen atoms (or oxygen molecules) 14 are contained in this atmosphere. The metal nitride film 17 is subjected to oxidation treatment in this atmosphere, whereby a metal oxynitride film (specifically a HfON film) 18 serving as a gate insulating film is formed from the metal nitride film 17. In this formation, an interface layer 3 is created between the silicon substrate 1 and the HfON film as the metal oxynitride film 18. The interface layer 3 is made of a silicon oxide film formed by oxidizing the surface of the silicon substrate 1, or a silicate film containing extremely small amounts of Hf and N.

Also in the second embodiment, as a generator of the oxygen radicals 13, a remote plasma treatment apparatus as shown in FIG. 5 is used like the first embodiment. To be more specific, the silicon substrate (silicon wafer) 1 is introduced into the chamber 51 of the remote plasma treatment apparatus 50 and placed on the substrate holder 52. Subsequently, a gas containing oxygen, such as $O_2$ gas or $N_2O$ gas, is introduced from the gas cylinder 54 into the radical generation chamber 53 placed on the chamber 51. RF power is applied to the radical generation chamber 53 to generate therein plasma 55 containing oxygen. The substrate holder 52 is kept at a floating potential, which limits an oxidizing species reaching the silicon wafer 1 to only the oxygen atoms (molecules) 14 other than oxygen ions and the oxygen radicals 13. In addition, the substrate temperature is kept at 400° C., which subjects the metal nitride film 17 made of HfN to oxidation treatment mainly using the oxygen radicals. In other words, oxygen can be injected into the HfN metal nitride film 17 to form the HfON metal oxynitride film 18.

After the formation of the HfON metal oxynitride film 18, that is, a high-k gate insulating film, thermal treatment is performed as an after treatment step as shown in FIG. 8C. This treatment is to sufficiently improve the film quality of the metal oxynitride film 18, such as the electric properties. In this thermal treatment after the formation of the HfON film, the treatment is performed in an atmosphere containing substantially no oxygen (oxidizing species) such as an atmosphere consisting of nitrogen shown in FIG. 8C or an atmosphere consisting of argon or other inert gas, which prevents oxygen from being supplied to the interface layer 3 and then suppresses an increase in thickness of the interface layer 3. This treatment can uniformly distribute oxygen supplied into the HfN metal nitride film, thereby changing the composition of the HfON metal oxynitride film 18 to a stoichiometric composition.

As described above, in the second embodiment, the metal nitride (HfN) serving as a material for a high-k gate insulating film is deposited in advance, after which the oxygen radicals 13 are used as an oxidizing species for the metal nitride. Therefore, an adequate adjustment of the oxidation treatment temperature enables supply of oxygen to the metal nitride in an oxidizing atmosphere having a high controllability. This oxidizes the metal nitride film 17 with oxidation of the silicon substrate 1 minimized, which suppresses creation of the interface layer 3 of a low dielectric constant. As a result, an insulating metal oxynitride film 18 of stoichiometric composition, that is to say, a high-k gate insulating film can be formed.

Further, the oxidation treatment using oxygen radicals according to the second embodiment has the superiority over the oxidation treatment using oxygen ions in that, for example, no direct impact by the plasma distribution or the like is exerted on the film uniformity (for example, if oxygen ions are used in the oxidation treatment, the plasma distribution exerts a direct impact on the film formation) and that the film quality does not suffer any damage by ion bombardment or the like.

In the second embodiment, the deposition step of the metal nitride film 17 is separated from the oxidation step of the metal nitride film 17, so that the oxidation process is not determined by the film deposition mechanism unlike the case of a conventional formation step of a metal oxide film in a high temperature atmosphere. In addition, the oxidation step of the metal nitride film 17 is a relatively low temperature process step performed by utilizing the reactivity of the oxygen radicals 13, which prevents the inter-diffusion between atoms constituting the film and the inter-diffusion between atoms constituting the film and silicon atoms contained in the silicon substrate even in depositing or oxidizing a composite film or a film with a gradient composition. Therefore, a composite metal oxynitride film can be formed which has a desired interface layer thickness and a desired composition.

In the first embodiment, the metal film 12 is oxidized to form the metal oxide film 2 serving as a gate insulating film. However, in the second embodiment, instead of this, the metal nitride film 17 is oxidized to form the metal oxynitride film 18 serving as the gate insulating film. This enhances the dielectric constant and the heat-resisting properties of the gate insulating film.

Note that in the second embodiment the silicon region with the high-k gate insulating film formed thereon is not limited to the silicon substrate 1. A silicon film may be used instead, or a substrate or a film mainly made of silicon may be used.

In the second embodiment, the metal nitride film 17 made of HfN is formed directly on the surface of the silicon substrate 1. As a substitute for this procedure, the surface of the silicon substrate 1 may be subjected to nitride treatment (pre-treatment) before the metal nitride film 17 is formed. This further suppresses creation of the interface layer.

In the second embodiment, description has been made of a Hf nitride as an exemplary material for the metal nitride film 17, but the material is not limited to this. Alternatively, a nitride of zirconium, titanium, tantalum, aluminum, or another metal (such as lanthanum (La), which is selected from the rare-earth metal group) may be used. This contributes to an increase in the dielectric constant of the metal oxynitride film (that is, the high-k gate insulating film) formed by oxidizing the metal nitride film. As an element constituting the metal nitride film 17 (other than nitrogen), two or more elements may be selected from hafnium, zirconium, titanium, tantalum, aluminum, another metal (such as lanthanum (La), which is selected from the rare-earth metal group), and silicon. This further enhances the dielectric constant and the heat-resisting properties of the high-k gate insulating film. In this selection, the two or more selected elements may be varied in their contents in the metal nitride film along the thickness direction of the metal nitride film.

In the second embodiment, the lower limit of the oxidation temperature for oxidizing the metal nitride film 17 may be equal to the minimum temperature capable of oxidizing the metal nitride film 17 by the oxygen radicals 13 (for example, 300° C.).

In the second embodiment, the upper limit of the oxidation temperature for oxidizing the metal nitride film 17 may be equal to the minimum temperature capable of developing oxidation of the metal nitride film 17 by oxygen atoms or oxygen molecules (for example, 500° C.).

In the second embodiment, an oxygen radical is used as a radical acting as an oxidizing species for the metal nitride film 17. Alternatively, use may be made of an NO radical, $N_2O$ radical or another radical.

In the second embodiment, after the formation step of the metal oxynitride film 18 shown in FIG. 8B, provision may be made of the step of depositing another metal nitride film (or a metal film; they can be replaced likewise in the subsequent situation) on the metal oxynitride film 18 in an atmosphere containing substantially no oxygen and the step of oxidizing another said metal nitride film in an atmosphere containing oxygen to form another metal oxynitride film serving as a gate insulating film. That is to say, deposition of a thin metal nitride film and oxidation of the thin metal nitride film may be repeatedly performed. This fully oxidizes the metal nitride film and then facilitates formation of a metal oxynitride film with stoichiometric composition.

In the second embodiment, the gate insulating film has been described as an exemplary use of the metal oxynitride film 18, that is, the high-k film. It is needless to say that the high-k film may alternatively be put to another use such as a capacitor insulating film.

Third Embodiment

The following description will be made of a method for fabricating a semiconductor device according to a third embodiment of the present invention and more specifically of a method for forming a gate insulating film with a high dielectric constant made of a metal oxide. A characteristic of the third embodiment is to employ, as a high dielectric material constituting the gate insulating film, a composite metal oxide film of every type of high dielectric material which is proposed as means for improving the effective dielectric constant and the heat-resisting properties of the gate insulating film. To be more specific, description will be made of a method for providing a composite metal oxide film made of a high dielectric material, that is, a metal oxynitride film used for a gate insulating film by subjecting a composite metal film to oxidation treatment using oxygen radicals.

Figure 9A:
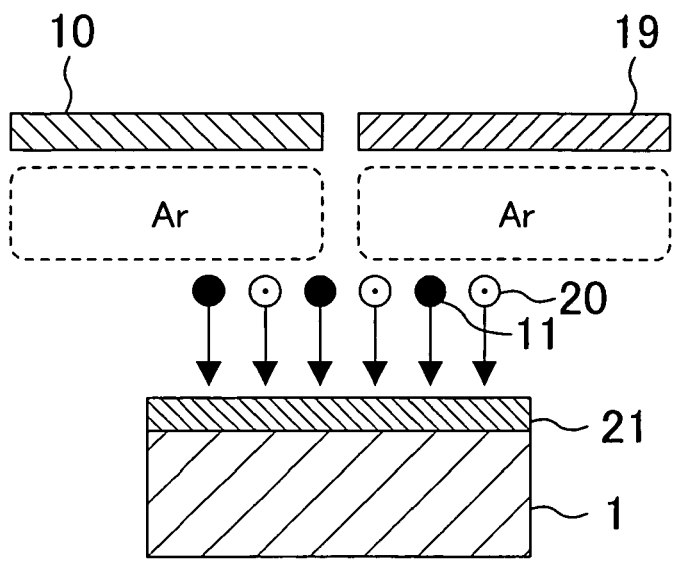
FIGS. 9A to 9C are sectional views illustrating process steps of the method for forming a high dielectric gate insulating film according to the third embodiment of the present invention.
Figure 9B:
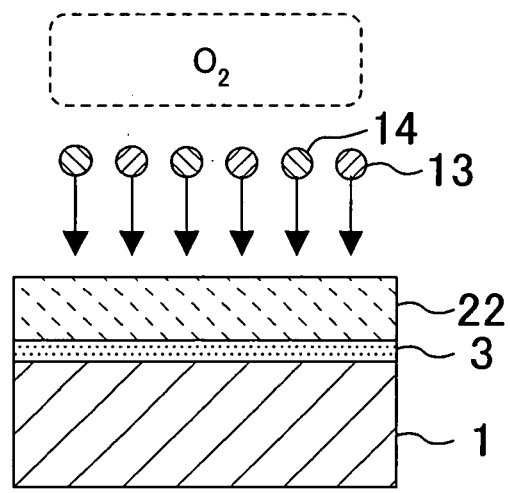
Figure 9C:
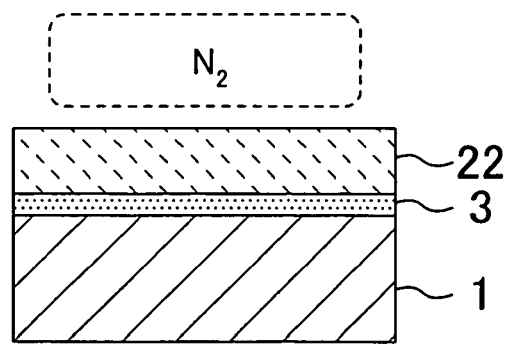

FIGS. 9A to 9C are sectional views illustrating process steps of the method for forming a high dielectric gate insulating film according to the third embodiment.

First, a native oxide on the surface of a p-type silicon substrate 1 is removed with hydrofluoric acid to expose the cleaned surface of the silicon substrate. In this step, the surface of the silicon substrate 1 may optionally be nitrided after the cleaning of the surface thereof. The resulting silicon substrate 1 is then introduced inside a chamber of a film growth apparatus (not shown). As the film growth apparatus, use is made of an apparatus based on PVD technique such as co-sputtering. Specifically, as shown in FIG. 9A, metal atoms (for example, Hf atoms) 11 and additive atoms 20 (for example, silicon (Si) or aluminum (Al)) are simultaneously or alternately impinged onto the silicon substrate 1 by the co-sputtering using a plurality of targets 10 and 19, thereby forming a composite metal film 21 with a desired composition (for example, a HfSi composite metal film made of Hf and Si, or a HfAl composite metal film made of Hf and Al) directly on the silicon substrate 1. In the case of forming a HfSi composite metal film as the composite metal film 21, using, inside the chamber, the target 10 of hafnium metal and another said target 19 of silicon acting as an additive element in a non-oxidizing atmosphere (see FIG. 9A) consisting of Ar gas, a voltage (direct current) is applied to allow the inside of the chamber to discharge. Thus, the HfSi composite metal film is formed by reactive sputtering.

In FIG. 9A, the input power placed on the targets 10 and 19 and the discharge period of time can be modulated to provide a composite metal film (HfSi, HfAl or the like) with both a composite structure and a gradient composition (a composition in which contained elements are varied in their contents in a film along the film thickness direction).

In the step shown in FIG. 9A, an alloy target (a target made of HfSi, HfAl or the like) may be used instead of the targets 10 and 19.

As is apparent from the above, the third embodiment differs from the first embodiment (see FIGS. 4A to 4C) in that instead of the Hf metal film 12, the composite metal film 21 made of HfSi, HfAl, or the like is formed on the silicon substrate 1.

Next, as shown in FIG. 9B, the surface of the composite metal film 21 made of HfSi or HfAl is exposed to an atmosphere mainly containing oxygen radicals 13 as an oxidizing species. During this exposure, considerable amounts of inactive oxygen atoms (or oxygen molecules) 14 are contained in this atmosphere. The composite metal film 21 is subjected to oxidation treatment in this atmosphere, whereby a composite metal oxide film (specifically a $HfSiO_2$ film or a $HfAlO_2$ film) 22 serving as a gate insulating film is formed from the composite metal film 21. In this formation, an interface layer 3 is created between the silicon substrate 1 and the composite metal oxide film 22. The interface layer 3 is made of a silicon oxide film formed by oxidizing the surface of the silicon substrate 1.

Also in the third embodiment, as a generator of the oxygen radicals 13, a remote plasma treatment apparatus as shown in FIG. 5 is used like the first embodiment. To be more specific, the silicon substrate (silicon wafer) 1 is introduced into the chamber 51 of the remote plasma treatment apparatus 50 and placed on the substrate holder 52. Subsequently, a gas containing oxygen, such as $O_2$ gas or $N_2O$ gas, is introduced from the gas cylinder 54 into the radical generation chamber 53 placed on the chamber 51. RF power is applied to the radical generation chamber 53 to generate therein plasma 55 containing oxygen. The substrate holder 52 is kept at a floating potential, which limits an oxidizing species reaching the silicon wafer 1 to only the oxygen atoms (molecules) 14 other than oxygen ions and the oxygen radicals 13. In addition, the substrate temperature is kept at 400° C., which subjects the composite metal film 21 made of HfSi, HfAl or the like to oxidation treatment mainly using the oxygen radicals. In other words, oxygen can be injected into the composite metal film 21 to form the composite metal oxide film 22 such as a $HfSiO_2$ film or a $HfAlO_2$ film.

After the formation of the composite metal oxide film 22, that is, a high-k gate insulating film, thermal treatment is performed as an after treatment step as shown in FIG. 9C. This treatment is to sufficiently improve the film quality of the composite metal oxide film 22, such as the electric properties. In this thermal treatment after the formation of the composite metal oxide film 22, the treatment is performed in an atmosphere containing substantially no oxygen (oxidizing species) such as an atmosphere consisting of nitrogen shown in FIG. 9C or an atmosphere consisting of argon or other inert gas, which prevents oxygen from being supplied to the interface layer 3 and then suppresses an increase in thickness of the interface layer 3. This treatment can uniformly distribute oxygen supplied into the composite metal film, thereby changing the composition of the composite metal oxide film 22 to a stoichiometric composition.

As described above, in the third embodiment, the composite metal (HfSi or HfAl) serving as a material for a high-k gate insulating film is deposited in advance, after which the oxygen radicals 13 are used as an oxidizing species for the composite metal. Therefore, an adequate adjustment of the oxidation treatment temperature enables supply of oxygen to the composite metal in an oxidizing atmosphere having a high controllability. This oxidizes the composite metal film 21 with oxidation of the silicon substrate 1 minimized, which suppresses creation of the interface layer 3 of a low dielectric constant. As a result, an insulating composite metal oxide film 22 of stoichiometric composition, that is to say, a high-k gate insulating film can be formed.

Further, the oxidation treatment using oxygen radicals according to the third embodiment has the superiority over the oxidation treatment using oxygen ions in that, for example, no direct impact by the plasma distribution or the like is exerted on the film uniformity (for example, if oxygen ions are used in the oxidation treatment, the plasma distribution exerts a direct impact on the film formation) and that the film quality does not suffer any damage by ion bombardment or the like.

Conventionally, if a composite film or a film with a gradient composition which uses various types of metal oxide films and which is proposed as means for enhancing the effective dielectric constant and the heat-resisting properties of a gate insulating film is employed for a high dielectric material constituting the gate insulating film, a gate insulating film exactly as designed is not always provided because of the inter-diffusion of these metal oxide films in the deposition or oxidation.

In contrast to this, in the third embodiment, the deposition step of the composite metal film 21 is separated from the oxidation step of the composite metal film 21, so that the oxidation process is not determined by the film deposition mechanism unlike the case of a conventional formation step of a metal oxide film in a high temperature atmosphere. In addition, the oxidation step of the composite metal film 21 is a relatively low temperature process step carried out by utilizing the reactivity of the oxygen radicals 13, which prevents the inter-diffusion between atoms constituting the film and the inter-diffusion between atoms constituting the film and silicon atoms contained in the silicon substrate even in depositing or oxidizing the composite metal film 21 (or a film with a gradient composition). Therefore, the composite metal oxide film 22 can be formed which has a desired interface layer thickness and a desire composition.

In the first embodiment, the metal film 12 is oxidized to form the metal oxide film 2 serving as a gate insulating film. However, in the third embodiment, instead of this, the composite metal film 21 is oxidized to form the composite metal oxide film 22 serving as the gate insulating film. This enhances the dielectric constant and the heat-resisting properties of the gate insulating film.

Note that in the third embodiment the silicon region with the high-k gate insulating film formed thereon is not limited to the silicon substrate 1. A silicon film may be used instead, or a substrate or a film mainly made of silicon may be used.

In the third embodiment, the composite metal film 21 made of HfSi or HfAl is formed directly on the surface of the silicon substrate 1. As a substitute for this procedure, the surface of the silicon substrate 1 may be subjected to nitride treatment (pretreatment) before the composite metal film 21 is formed. This further suppresses creation of the interface layer.

In the third embodiment, description has been made of HfSi or HfAl as an exemplary material for the composite metal film 21, but the material is not limited to this. Alternatively, as an element constituting the composite metal film 21, two or more elements may be selected from zirconium, titanium, tantalum, aluminum, another metal (such as lanthanum (La), which is selected from the rare-earth metal group), and silicon. Moreover, a composite metal oxynitride film may be formed by introducing, like the second embodiment, nitrogen in the deposition atmosphere during the deposition of the composite metal film 21 to form a composite metal nitride film and oxidizing the formed composite metal nitride film.

In the third embodiment, the lower limit of the oxidation temperature for oxidizing the composite metal film 21 may be equal to the minimum temperature capable of oxidizing the composite metal film 21 by the oxygen radicals 13 (for example, 300° C.).

In the third embodiment, the upper limit of the oxidation temperature for oxidizing the composite metal film 21 may be equal to the minimum temperature capable of developing oxidation of the composite metal film 21 by oxygen atoms or oxygen molecules (for example, 500° C.).

In the third embodiment, an oxygen radical is used as a radical acting as an oxidizing species for the composite metal film 21. Alternatively, use may be made of an NO radical, $N_2O$ radical or another radical.

In the third embodiment, after the formation step of the composite metal oxide film 22 shown in FIG. 9B, provision may be made of the step of depositing another composite metal film (or a metal film; they can be replaced likewise in the subsequent situation) on the composite metal oxide film 22 in an atmosphere containing substantially no oxygen and the step of oxidizing another said composite metal film in an atmosphere containing oxygen to form another composite metal oxide film serving as a gate insulating film. That is to say, deposition of a thin composite metal film and oxidation of the thin composite metal film may be repeatedly performed. This fully oxidizes the composite metal film and then facilitates formation of a composite metal oxide film with stoichiometric composition.

In the third embodiment, the gate insulating film has been described as an exemplary use of the composite metal oxide film 22, that is, the high-k film. It is needless to say that the high-k film may alternatively be put to another use such as a capacitor insulating film.

In consideration of the effect exerted on the reliability of the gate insulating film or the carrier mobility of the device in each embodiment of the present invention, it does not simply mean that it is much better to make the interface layer thinner. It is more important to control the thickness of the interface layer at a desired value. To realize this control, in the embodiments of the present invention, the number of oxygen radicals impinging onto the metal film (the metal nitride film or the composite metal film) or the time or the temperature of oxidation treatment with the oxygen radicals can be adjusted to control the thickness of the interface layer created at the interface between the metal oxide film (the metal oxynitride film or the composite metal oxide film) and the silicon substrate.

What is claimed is:

1. A method for fabricating a semiconductor device, comprising the steps of:
   depositing a metal film on a silicon region inside a chamber having a non-oxidizing atmosphere using a target made of a metal; and
   oxidizing the metal film with oxygen radicals to form a metal oxide film serving as a gate insulating film,
   wherein said oxidizing is performed such that oxidation of said metal film by oxygen ions is suppressed or prevented and an Equivalent Oxide Thickness of an interface layer formed between the gate insulating film and the silicon region is 0.5 nm or less.

2. The method of claim 1, wherein the oxygen radicals are supplied by a plasma generator using a gas containing oxygen.

3. The method of claim 1, wherein the oxygen radicals are supplied by an ozone generator.

4. The method of claim 1, wherein the oxidation of the metal film is performed on a sample holder kept at a floating electric potential.

5. The method of claim 1, wherein the upper limit of the oxidation temperature for oxidizing the metal film is equal to the minimum temperature capable of developing oxidation of the metal film by oxygen atoms or oxygen molecules.

6. The method of claim 1, wherein the upper limit of the oxidation temperature for oxidizing the metal film is 500° C.

7. The method of claim 1, wherein in oxidizing the metal film, the number of oxygen radicals impinging onto the metal film, or the time or the temperature of the oxidation treatment with the oxygen radicals is adjusted to control the thickness of an interface layer created at the interface between the metal oxide film and the silicon region.

8. The method of claim 1, wherein in depositing the metal film, the thickness of the metal film is set so that the metal oxide film formed by oxidizing the metal film has a thickness less than 3 nm.

9. The method of claim 1, wherein in depositing the metal film, the thickness of the metal film is set at less than 1.9 nm.

10. The method of claim 1, wherein an element constituting the metal film is selected from the group consisting of hafnium, zirconium, titanium, tantalum, and aluminum.

11. The method of claim 10, wherein two or more elements constituting the metal film are selected from the group.

12. The method of claim 1, wherein after the formation of the gate insulating film, the gate insulating film is subjected to thermal treatment.

13. The method of claim 12, wherein the thermal treatment is performed in an atmosphere containing substantially no oxygen.

14. A method for fabricating a semiconductor device, comprising the steps of:
depositing a first metal film on a silicon region inside a chamber having a non-oxidizing atmosphere using a target made of a metal;
forming a metal oxide film by oxidizing the first metal film with radicals serving as a gate insulating film, said oxidizing is performed such that oxidation of said first metal film by ions is suppressed or prevented; and
forming a second metal film on the metal oxide film serving as a gate electrode,
wherein an Equivalent Oxide Thickness of an interface layer formed between the gate insulating film and the silicon region is 0.5 nm or less.

15. The method of claim 1, wherein the metal film is amorphous.

16. A method for fabricating a semiconductor device, comprising the steps of:
depositing a metal film on a silicon region inside a chamber having a non-oxidizing atmosphere using a target made of a metal; and
oxidizing the metal film with oxygen radicals to form a metal oxide film serving as a gate insulating film,
wherein an Equivalent Oxide Thickness of an interface layer formed between the gate insulating film and the silicon region is 0.5 nm or less, and
the oxygen radicals are supplied by a plasma generator using a gas containing oxygen.

17. A method for fabricating a semiconductor device, comprising the steps of:
depositing a first metal film on a silicon region inside a chamber having a non-oxidizing atmosphere using a target made of a metal;
forming a metal oxide film by oxidizing the first metal film with radicals serving as a gate insulating film; and
forming a second metal film on the metal oxide film serving as a gate electrode,
wherein an Equivalent Oxide Thickness of an interface layer formed between the gate insulating film and the silicon region is 0.5 nm or less, and
wherein the radicals are supplied by a plasma generator using a gas containing oxygen.

18. A method for fabricating a semiconductor device, comprising the steps of:
depositing a first metal film on a silicon region inside a chamber having a non-oxidizing atmosphere using a target made of a metal;
forming a metal oxide film by oxidizing the first metal film with radicals serving as a gate insulating film; and
forming a second metal film on the metal oxide film serving as a gate electrode,
wherein an Equivalent Oxide Thickness of an interface layer formed between the gate insulating film and the silicon region is 0.5 nm or less, and
wherein the radicals are supplied by an ozone generator.

19. The method of claim 14, wherein the radicals are supplied by a plasma generator using a gas containing oxygen.

20. The method of claim 14, wherein the radicals are supplied by an ozone generator.

21. The method of claim 14, wherein the oxidation of the metal film is performed on a sample holder kept at a floating electric potential.

22. The method of claim 16, wherein the oxidation of the metal film is performed on a sample holder kept at a floating electric potential.

23. The method of claim 17, wherein the oxidation of the metal film is performed on a sample holder kept at a floating electric potential.

24. The method of claim 14, wherein the upper limit of the oxidation temperature for oxidizing the metal film is equal to the minimum temperature capable of developing oxidation of the metal film by oxygen atoms or oxygen molecules.

25. The method of claim 16, wherein the upper limit of the oxidation temperature for oxidizing the metal film is equal to the minimum temperature capable of developing oxidation of the metal film by oxygen atoms or oxygen molecules.

26. The method of claim 16, wherein the upper limit of the oxidation temperature for oxidizing the metal film is equal to the minimum temperature capable of developing oxidation of the metal film by oxygen atoms or oxygen molecules.

27. The method of claim 14, wherein the upper limit of the oxidation temperature for oxidizing the metal film is 500° C.

28. The method of claim 16, wherein the upper limit of the oxidation temperature for oxidizing the metal film is 500° C.

29. The method of claim 16, wherein the upper limit of the oxidation temperature for oxidizing the metal film is 500° C.

30. The method of claim 14, wherein in oxidizing the metal film, the number of radicals impinging onto the metal film, or the time or the temperature of the oxidation treatment with the radicals is adjusted to control the thickness of an interface layer created at the interface between the metal oxide film and the silicon region.

31. The method of claim 16, wherein in oxidizing the metal film, the number of oxygen radicals impinging onto the metal film, or the time or the temperature of the oxidation treatment with the oxygen radicals is adjusted to control the thickness of an interface layer created at the interface between the metal oxide film and the silicon region.

32. The method of claim 17, wherein in oxidizing the metal film, the number of radicals impinging onto the metal film, or the time or the temperature of the oxidation treatment with the radicals is adjusted to control the thickness of an interface layer created at the interface between the metal oxide film and the silicon region.

33. The method of claim 14, wherein in depositing the metal film, the thickness of the metal film is set so that the metal oxide film formed by oxidizing the metal film has a thickness less than 3 nm.

34. The method of claim 16, wherein in depositing the metal film, the thickness of the metal film is set so that the metal oxide film formed by oxidizing the metal film has a thickness less than 3 nm.

35. The method of claim 17, wherein in depositing the metal film, the thickness of the metal film is set so that the metal oxide film formed by oxidizing the metal film has a thickness less than 3 nm.

36. The method of claim 14, wherein in depositing the metal film, the thickness of the metal film is set at less than 1.9 nm.

37. The method of claim 16, wherein in depositing the metal film, the thickness of the metal film is set at less than 1.9 nm.

38. The method of claim 17, wherein in depositing the metal film, the thickness of the metal film is set at less than 1.9 nm.

39. The method of claim 14, wherein an element constituting the metal film is selected from the group consisting of hafnium, zirconium, titanium, tantalum, aluminum, and silicon.

40. The method of claim 16, wherein an element constituting the metal film is selected from the group consisting of hafnium, zirconium, titanium, tantalum, aluminum, and silicon.

41. The method of claim 17, wherein an element constituting the metal film is selected from the group consisting of hafnium, zirconium, titanium, tantalum, aluminum, and silicon.

42. The method of claim 39, wherein two or more elements constituting the metal film are selected from the group.

43. The method of claim 40, wherein two or more elements constituting the metal film are selected from the group.

44. The method of claim 41, wherein two or more elements constituting the metal film are selected from the group.

45. The method of claim 14, wherein after the formation of the gate insulating film, the gate insulating film is subjected to thermal treatment.

46. The method of claim 16, wherein after the formation of the gate insulating film, the gate insulating film is subjected to thermal treatment.

47. The method of claim 17, wherein after the formation of the gate insulating film, the gate insulating film is subjected to thermal treatment.

48. The method of claim 45, wherein the thermal treatment is performed in an atmosphere containing substantially no oxygen.

49. The method of claim 46, wherein the thermal treatment is performed in an atmosphere containing substantially no oxygen.

50. The method of claim 47, wherein the thermal treatment is performed in an atmosphere containing substantially no oxygen.

51. The method of claim 14, wherein the metal film is amorphous.

52. The method of claim 16, wherein the metal film is amorphous.

53. The method of claim 17, wherein the metal film is amorphous.

* * * * *

UNITED STATES PATENT AND TRADEMARK OFFICE
CERTIFICATE OF CORRECTION

PATENT NO. : 7,488,655 B2
APPLICATION NO. : 10/756248
DATED : February 10, 2009
INVENTOR(S) : Shigenori Hayashi et al.

It is certified that error appears in the above-identified patent and that said Letters Patent is hereby corrected as shown below:

ON THE TITLE PAGE:

In Item "(56) References Cited" add --Chinese Office Action issued in Application No. 2006/0073679.2 and Translation--;

In Item "(56) References Cited" change "2002/0014834" to --2002/0014634--;

In Item "(56) References Cited" add --Milton Ohring's "The Materials Science of Thin Films", Academic Press, Inc. New York, 1992, pp. 234-237--;

IN THE CLAIMS:

In Column 20, Line 18, change, "26. The method of claim 16" to --26. The method of claim 17--;

In Column 20, Line 26, change, "29. The method of claim 16" to --29. The method of claim 17--;

Please add Claim 54 as follows:

--54. A method for fabricating a semiconductor device, comprising the steps of:

depositing a metal film on a silicon region inside a chamber having a non-oxidizing atmosphere using a target made of a metal; and oxidizing the metal film with oxygen radicals to form a metal oxide film serving as a gate insulating film,

UNITED STATES PATENT AND TRADEMARK OFFICE
CERTIFICATE OF CORRECTION

PATENT NO.       : 7,488,655 B2
APPLICATION NO.  : 10/756248
DATED            : February 10, 2009
INVENTOR(S)      : Shigenori Hayashi et al.

It is certified that error appears in the above-identified patent and that said Letters Patent is hereby corrected as shown below:

wherein an Equivalent Oxide Thickness of an interface layer formed between the gate insulating film and the silicon region is 0.5 nm or less, and the oxygen radicals are supplied by an ozone generator.--

Signed and Sealed this

Thirtieth Day of June, 2009

JOHN DOLL
*Acting Director of the United States Patent and Trademark Office*

UNITED STATES PATENT AND TRADEMARK OFFICE
CERTIFICATE OF CORRECTION

| | | |
|---|---|---|
| PATENT NO. | : 7,488,655 B2 | |
| APPLICATION NO. | : 10/756248 | |
| DATED | : February 10, 2009 | |
| INVENTOR(S) | : Shigenori Hayashi et al. | |

It is certified that error appears in the above-identified patent and that said Letters Patent is hereby corrected as shown below:

ON THE TITLE PAGE:

In Item "(56) References Cited" add --Chinese Office Action issued in Application No. 2006/0073679.2 and Translation--;

In Item "(56) References Cited" change "2002/0014834" to --2002/0014634--;

In Item "(56) References Cited" add --Milton Ohring's "The Materials Science of Thin Films", Academic Press, Inc. New York, 1992, pp. 234-237--;

IN THE CLAIMS:

In Column 20, Line 18, change, "26. The method of claim 16" to --26. The method of claim 17--;

In Column 20, Line 26, change, "29. The method of claim 16" to --29. The method of claim 17--;

In Column 22, Line 22, please add Claim 54 as follows:

--54. A method for fabricating a semiconductor device, comprising the steps of:

depositing a metal film on a silicon region inside a chamber having a non-oxidizing atmosphere using a target made of a metal; and oxidizing the metal film with oxygen radicals to form a metal oxide film serving as a gate insulating film,

UNITED STATES PATENT AND TRADEMARK OFFICE
CERTIFICATE OF CORRECTION

PATENT NO. : 7,488,655 B2
APPLICATION NO. : 10/756248
DATED : February 10, 2009
INVENTOR(S) : Shigenori Hayashi et al.

It is certified that error appears in the above-identified patent and that said Letters Patent is hereby corrected as shown below:

wherein an Equivalent Oxide Thickness of an interface layer formed between the gate insulating film and the silicon region is 0.5 nm or less, and the oxygen radicals are supplied by an ozone generator.--

This certificate supersedes the Certificate of Correction issued June 30, 2009.

Signed and Sealed this

Twenty-eighth Day of July, 2009

JOHN DOLL
*Acting Director of the United States Patent and Trademark Office*